United States Patent
Sharma et al.

(10) Patent No.: US 6,625,059 B1
(45) Date of Patent: Sep. 23, 2003

(54) SYNTHETIC FERRIMAGNET REFERENCE LAYER FOR A MAGNETIC STORAGE DEVICE

(75) Inventors: Manish Sharma, Sunnyvale, CA (US); Lung The Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/093,344

(22) Filed: Mar. 6, 2002

(51) Int. Cl.$^7$ .......................... G11C 11/15; G11C 11/14
(52) U.S. Cl. .......................... 365/173; 365/171; 365/97
(58) Field of Search .......................... 365/173, 97, 171, 365/232, 213, 50, 55, 66, 74

(56) References Cited

U.S. PATENT DOCUMENTS

| | | | |
|---|---|---|---|
| 6,072,718 A | * | 6/2000 | Abraham et al. ............ 365/173 |
| 6,385,082 B1 | * | 5/2002 | Abraham et al. ............ 365/171 |
| 6,501,678 B1 | * | 12/2002 | Lenssen et al. ............. 365/173 |

* cited by examiner

Primary Examiner—Thong Le

(57) ABSTRACT

A synthetic ferrimagnet reference layer for a magnetic storage device. The reference layer has first and second layers of magnetic material operable to be magnetized in first and second magnetic orientations. A spacer layer between the layers of magnetic material is of suitable dimensions to magnetically couple the magnetic layers in opposite directions. The layers of magnetic material have substantially the same coercivities.

33 Claims, 9 Drawing Sheets

SYNTHETIC FERRIMAGNET REFERENCE LAYER FOR A MAGNETIC STORAGE DEVICE

TECHNICAL FIELD

The present invention relates to the field of magnetic storage devices. More particularly, the present invention relates to a synthetic ferrimagnet reference layer for a magnetic storage device.

BACKGROUND ART

Magnetic Random Access Memory (MRAM) is a non-volatile memory that has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives.

A typical MRAM device includes an array of memory cells, word lines extending along rows of the memory cells, and bit lines extending along columns of the memory cells. Each memory cell is located at a cross point of a word line and a bit line.

The memory cells may be based on tunneling magneto-resistive (TMR) devices such as spin dependent tunneling junctions (SDT). A typical SDT junction includes a pinned layer, a sense layer and an insulating tunnel barrier sandwiched between the pinned and sense layers. The pinned layer has a magnetization orientation that is fixed so as not to rotate in the presence of an applied magnetic field in a range of interest. The sense layer has a magnetization that can be oriented in either of two directions: the same direction as the pinned layer magnetization or the opposite direction of the pinned layer magnetization. If the magnetizations of the pinned and sense layers are in the same direction, the orientation of the SDT junction is said to be "parallel." If the magnetizations of the pinned and sense layers are in opposite directions, the orientation of the SDT junction is said to be "anti-parallel." These two stable orientations, parallel and anti-parallel, may correspond to logic values of '0' and '1'.

The magnetization orientation of the pinned layer may be fixed by an underlying antiferromagnetic (AF) pinning layer. The AF pinning layer provides a large exchange field, which holds the magnetization of the pinned layer in one direction. Underlying the AF layer are usually first and second seed layers. The first seed layer allows the second seed layer to be grown with a crystal structure orientation. The second seed layer establishes a crystal structure orientation for the AF pinning layer.

The pinned layer in some conventional magneto-resistive memory devices may have a net magnetic moment, which leads to undesirable effects. One such effect is that of a demagnetizing field. For example, the magnetic layer of the pinned layer reaches and interacts with the sense layer. As the sense layer stores information by the orientation of its magnetization, clearly its magnetic orientation must be preserved. Thus, the interaction of the magnetic field from the pinned layer may lead to loss of data if this magnetic field becomes too strong. A second problem is that the presence of the magnetic field from the pinned layer requires that an asymmetric magnetic field be used to switch the state of the data layer, which adds to the complexity of the writing process. A still further problem is that the tolerance for stray magnetic fields during writing is lowered.

As it is desirable to fabricate high capacity memories, it is desirable to fabricate an array of such memory cells as dense as possible. Unfortunately, the cumulative demagnetizing effects of all of the reference layers may constrain how densely the memory cells may be packed.

Another disadvantage of pinned structures is that the materials needed to achieve pinning (e.g., the AF pinning layer and the seed layer) are both complicated and expensive to fabricate.

Therefore, a need exists for an information storage device using magneto-resistive memory cells. A further need exists for such a device that minimizes a demagnetizing field that may be present in conventional magnetic storage devices. A still further need exists for a device that may be fabricated more economically and with fewer and simpler materials than conventional magnetic storage devices.

DISCLOSURE OF THE INVENTION

Accordingly, embodiments of the present invention provide a synthetic ferrimagnet reference layer for a magnetic storage device. Embodiments of the present invention provide for a device that minimizes a demagnetizing field that may be present in conventional magnetic storage devices. A synthetic ferrimagnet reference layer for a magnetic storage device is disclosed. The reference layer has first and second layers of magnetic material operable to be magnetized in first and second magnetic orientations. A spacer layer between the layers of magnetic material is of suitable dimensions to magnetically couple the magnetic layers in opposite directions. The layers of magnetic material have substantially the same coercivities.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

In the following detailed description of the present invention, numerous specific details are set forth in order to provide a thorough understanding of the present invention. However, it will be obvious to one skilled in the art that the present invention may be practiced without these specific details or by using alternate elements or methods. In other instances well known methods, procedures, components, and circuits have not been described in detail as not to unnecessarily obscure aspects of the present invention.

Figure 1:
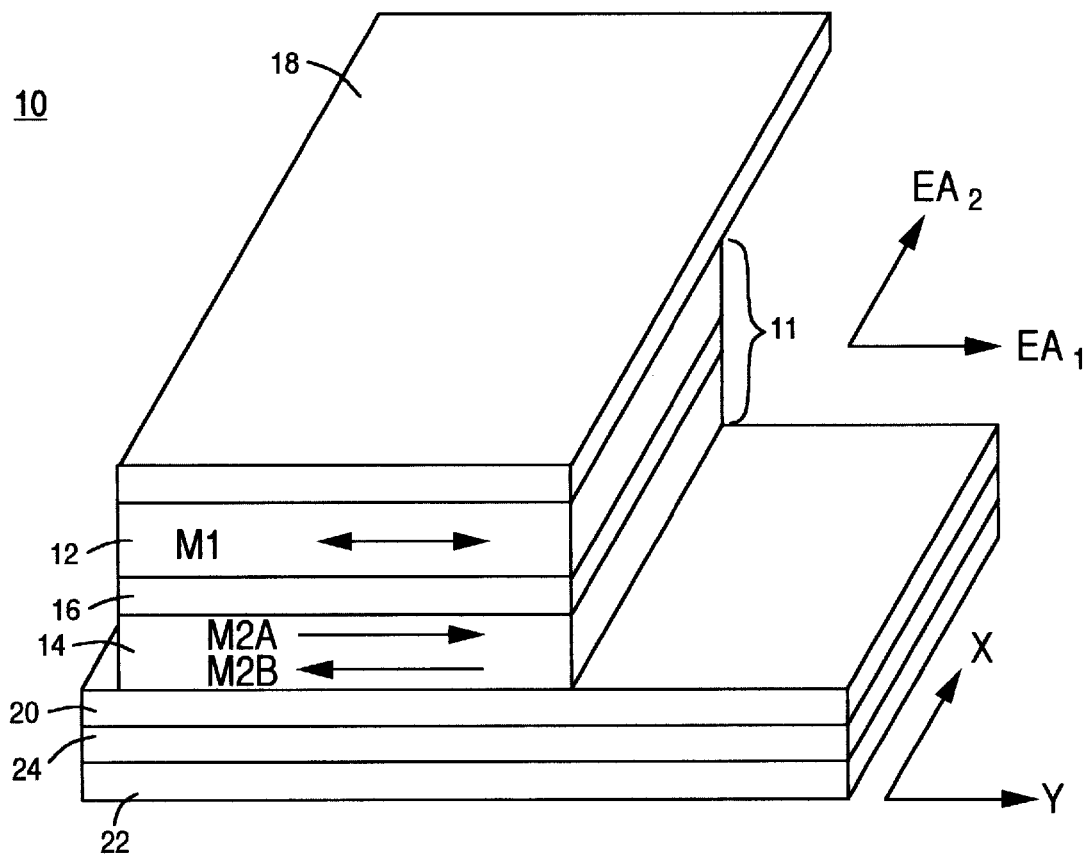
FIG. 1 is an illustration of a magnetic memory device according to embodiments of the present invention.

Referring to FIG. 1, a magnetic memory device 10 includes a magnetic tunnel junction 11 having a data layer 12, a reference layer 14, and a tunnel barrier 16 between the data and reference layers 12 and 14. Both layers 12 and 14 may be made of a ferromagnetic material. The data layer 12 has a magnetization (represented by the vector Ml) that can be orientated in either of two directions, typically along the easy axis (EA1) of the data layer 12.

The reference layer 14 may be constructed to have a net magnetic moment that is substantially zero. Hence, it may be stated that the net magnetization vector of the reference layer 14 is substantially zero. However, the reference layer 14 may have multiple magnetization vectors, such as, for example, magnetization vector M2A and M2B. These two vectors may be equal and opposite and hence may cancel each other at a distance. However, magnetization vector M2A may be closer to the tunnel barrier 16 than is magnetization vector M2B. The two magnetization vectors M2A and M2B may be orientated in either of two directions, typically along the y-axis. However, the magnetization vectors M2A and M2B are not necessarily orthogonal to the easy axis (EA2) of the reference layer 14.

If the magnetizations vectors of the data and reference layers 12 and 14 (M1 and M2A) are pointing in the same direction, the orientation of the magnetic tunnel junction 11 may be referred to as being "parallel." If the magnetization vectors (M1 and M2A) of the data and reference layers 12 and 14 are pointing in opposite directions, the orientation of the magnetic tunnel junction 11 may be referred to as being "anti-parallel." These two orientations, parallel and anti-parallel, may correspond to logic values of '0' and '1'. The logic value that is represented by which orientation is arbitrary.

The insulating tunnel barrier 16 allows quantum mechanical tunneling to occur between the data and reference layers 12 and 14. This tunneling phenomenon is electron spin dependent, causing the resistance of the magnetic tunnel junction 11 to be a function of the relative orientations of the magnetization vectors (M1 and M2A) of the data and reference layers 12 and 14. Thus, a bit may be stored by establishing the magnetization orientation of the data 12 and reference layers 14 to be different. For example, the resistance of the magnetic tunnel junction 11 is a first value (R) if the magnetization orientation of the magnetic tunnel junction 11 is parallel and a second value (R+ΔR) if the magnetization orientation is anti-parallel. However, the present invention is not limited to the magnetization orientation of the two layers relative to each other being either parallel or anti-parallel. More generally, the magnetic orientation of each layer may be selected such that the measured resistance between the layers is different for two different states. The two stable orientations may comprise a first range of angles and a second range of angles between the magnetic orientation magnetization vectors (M1 and M2A) of the data and reference layers 12 and 14, wherein the electrical resistance across the tunnel layer has first and second resistances corresponding to the two stables orientations.

The insulating tunnel barrier 16 may be made of aluminum oxide ($Al_2O_3$), silicon dioxide ($SiO_2$), tantalum oxide ($Ta_2O_5$), silicon nitride ($SiN_4$), aluminum nitride ($AlN_x$), or magnesium oxide (MgO). Other dielectrics and certain semiconductor materials may be used for the insulating tunnel barrier 16. Thickness of the insulating tunnel barrier 16 may range from about 0.5 nanometers to about three nanometers. However, the present invention is not limited to this range.

The data layer 12 may be made of a ferromagnetic material. The reference layer 14 may be implemented as a synthetic ferrimagnet (SF), also known as an artificial anti-ferromagnet.

A first conductor 18 extending along the y-axis is in contact with the data layer 12. A second conductor 20 extending along the x-axis is in contact with the reference layer 14. The first and second conductors 18 and 20 are shown as being orthogonal. However, the present invention is not limited to an orthogonal orientation. Below the second conductor 20 is a third conductor 22, which also extends along the x-axis. An electrical insulator 24 (e.g., a layer of dielectric material) separates the second and third conductors 20 and 22. The conductors 18, 20 and 22 may be made of an electrically conductive material such as aluminum, copper, gold or silver.

Figure 2A:
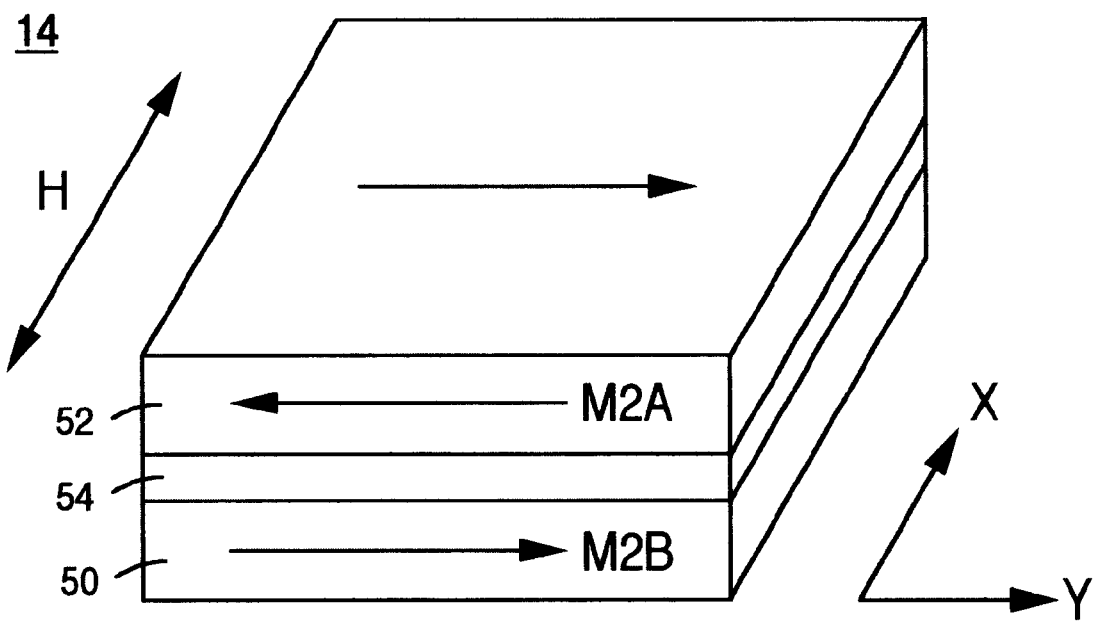
FIG. 2A and FIG. 2B are illustrations of reference layers according to embodiments of the present invention.
Figure 2B:
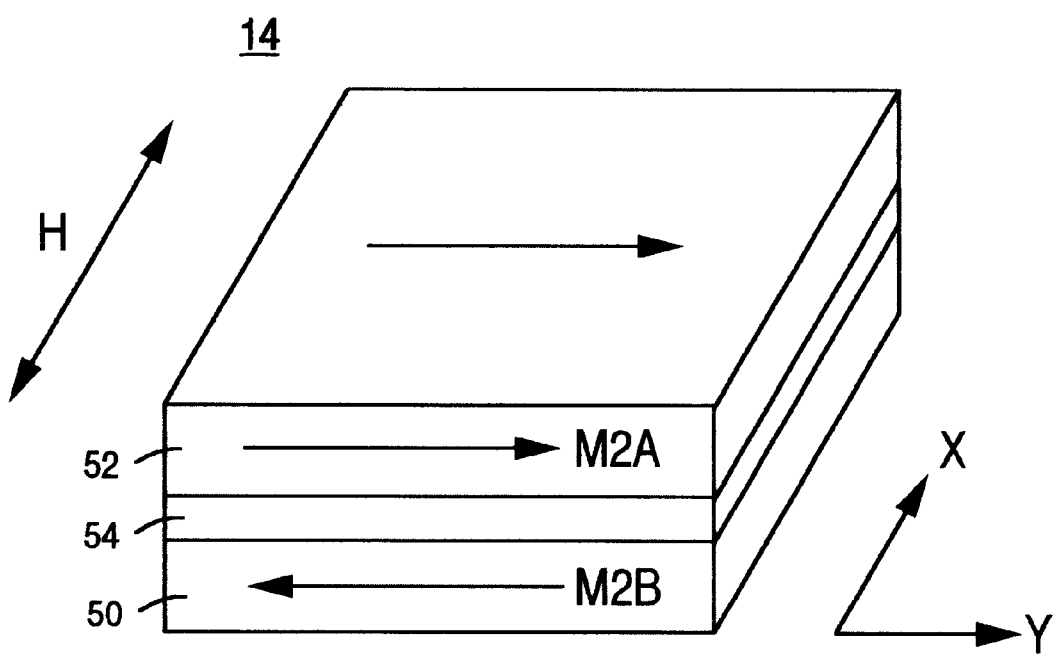

Referring now to FIGS. 2A and 2B, the synthetic ferrimagnet reference layer 14 may include first and second ferromagnetic layers 50 and 52 separated by a spacer layer 54 (e.g., the spacer layer 54 may be metallic). The ferromagnetic layers 50 and 52 may be made of a material such as, for example, cobalt iron (CoFe), nickel iron (NiFe), Cobalt (Co), etc., and the spacer layer 54 may be made of an electrically conductive, magnetically non-conductive material such as, for example, Ruthenium (Ru), Rhenium (Re), Rhodium (Rh), Copper (Cu), Tellurium (Te), Chromium (Cr), etc.

The dimensions (e.g., thickness) of the spacer layer 54 may be selected to cause the first and second ferromagnetic layers 50 and 52 to be coupled, such that their magnetic orientations are anti-parallel, as seen in FIGS. 2A and 2B. The thickness may depend on the material that the spacer layer 54 is formed from. In one embodiment, the thickness may be between about 0.2 nm and 2 nm. However, other thicknesses may be suitable to couple the two ferromagnetic layers 50 and 52.

For example, the magnetization vector of the upper ferromagnetic layer 52 (M2A) is shown along the negative y-axis. The magnetization vector of the lower ferromagnetic layer 50 (M2B) is shown along the positive y-axis, in FIG. 2A.

The ultra-low coercivity allows the magnetization vectors (M2A and M2B) of the SF reference layer 14 to be switched easily between the orientations shown in FIGS. 2A and 2B. In practice, the orientations of the magnetic vectors M2A and M2B for the ferromagnetic layers 50 and 52 may be in any direction just before the magnetic field is applied. Once the magnetic field is applied, their orientations are known. Only a very small magnetic field needs to be applied to the ferromagnetic layers 50 and 52 to push the magnetization vectors M2A and M2B to known positions shown in FIG. 2A or 2B, (e.g., orthogonal to the applied magnetic field).

In some embodiments of the present invention, the synthetic ferrimagnet reference layer 14 comprises more than two ferromagnetic layers. In these embodiments, adjacent ferromagnetic layers may be joined by spacer layers 54 and may have their magnetic orientations in opposite directions. The net magnetic moment of the synthetic ferrimagnet reference layer 14 is substantially zero. Embodiments provide for both even and odd numbers of ferromagnetic layers in a synthetic ferrimagnet reference layer 14.

Figure 3A:
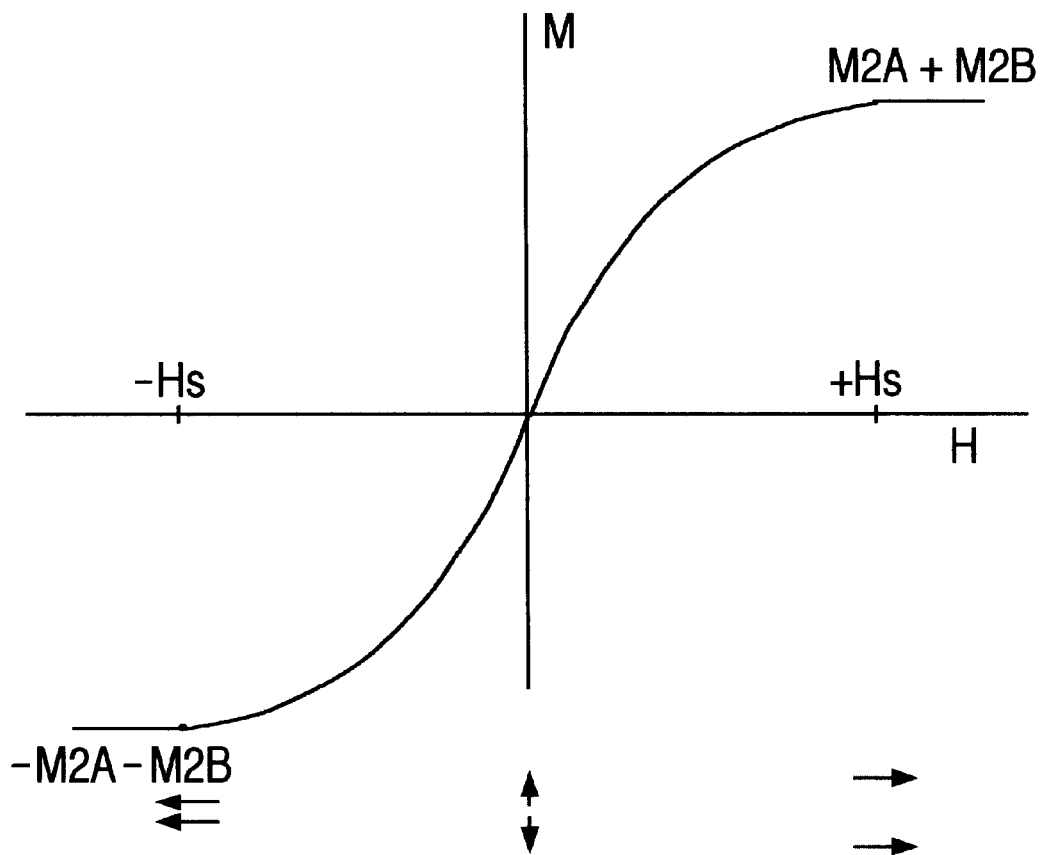
FIG. 3A is an illustration of a hysteresis loop for a reference layer according to embodiments of the present invention.

FIG. 3A illustrates a typical hysteresis loop for a synthetic ferrimagnet reference layer 14 with exemplary dimensions and materials of CoFe 3 nm/Ru 0.75 nm/CoFe 3 nm. Individually each ferromagnetic layer 50, 52 may, for example, have a coercivity of about 10–100 Oersted (e.g., about 800–8000 Amperes/Meter) and have similar hysteresis loops. However, the present invention is not limited to this range of coercivities. The coercivities of the two ferromagnetic layers 50 and 52 may be substantially the same. This may be accomplished by using the same thickness of identical materials; however, the present invention is not limited to this way of achieving substantially identical coercivities. Furthermore, it is not required that each ferromagnetic layer has the same coercivity. For embodiments with more than two ferromagnetic layers, the combined coercivities of the ferromagnetic layers may cause the net magnetic moment of the reference layer 14 to be substantially zero.

As illustrated, the hysteresis loop for the combined ferromagnetic layers 50 and 52 may pass though the origin where the net magnetic moment is zero. For embodiments with more than two ferromagnetic layers, the combined moments of the ferromagnetic layers causes the net magnetic moment of the reference layer 14 to be substantially zero. Thus, in some embodiments, the ferromagnetic layers do not have identical moments.

Exchange coupling between the magnetization vectors M2A, M2B of the two ferromagnetic layers 50 and 52 may be very strong. Consequently, a very large magnetic field may be needed to saturate the magnetization vectors M2A, M2B of the ferromagnetic layers 50 and 52. For example, a field of 4000 Oersted (e.g., $3.2 \times 10^5$ Amperes/Meter) may be needed to completely rotate both the ferromagnetic layers 50 and 52 in the same direction. By selecting suitable thickness and material for the spacer layer 54, the exchange coupling may be made suitably strong such that at normal operating conditions, very little rotation occurs and the ferromagnetic layers 50 and 52 point 180 degrees apart.

Figure 4A:
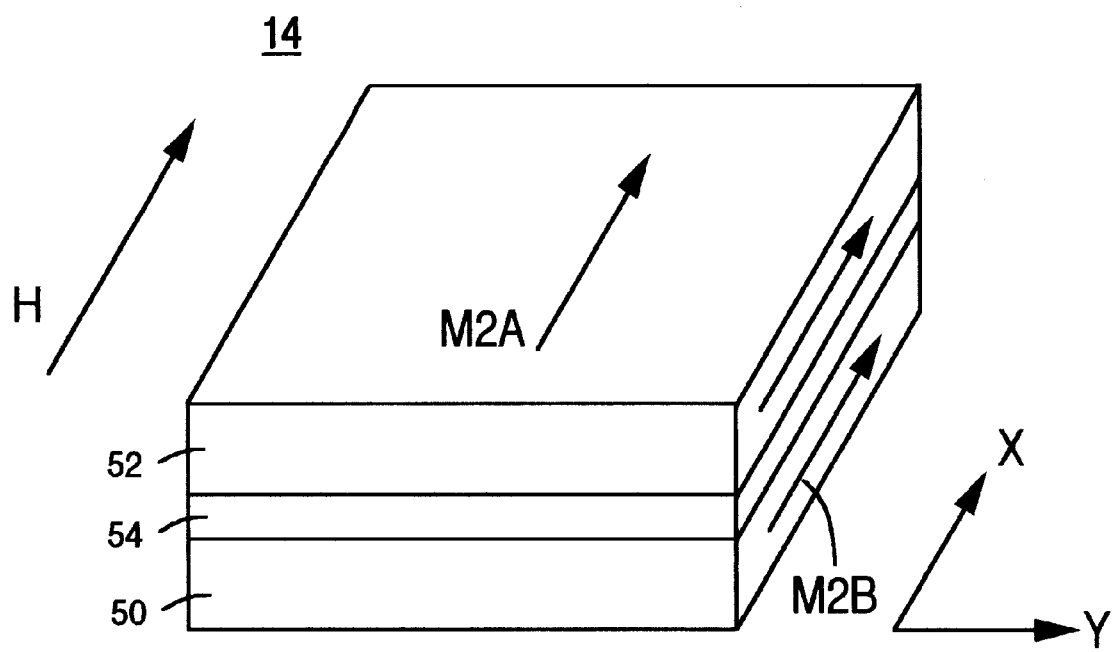
FIG. 4A and FIG. 4B are illustrations of reference layers according to embodiments of the present invention.
Figure 4B:
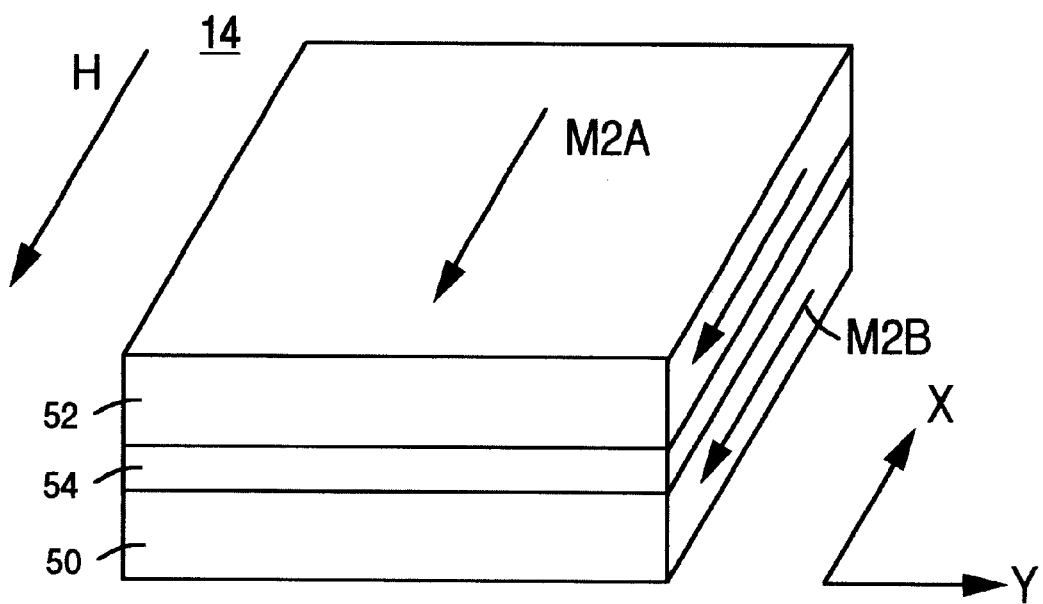

Still referring to FIG. 3A, when exposed to a relatively high magnetic field, the ferromagnetic layers 50 and 52 may rotate and orient themselves in the direction of the applied field. This is illustrated by the parallel double arrows below the hysteresis loop at the point when Hs is large (positive or negative). This is also illustrated in FIGS. 4A and 4B, in which the magnetization vectors M2A and M2B are shown as being parallel to the applied magnetic field (H). The fields required to saturate both the ferromagnetic layers 50 and 52 are substantially larger than normally used to read a magneto-resistive device.

Under lower magnetic fields, there may be two stable magnetization orientations and these may be orthogonal to the applied field. Referring again to FIG. 3A, when near the y-axis, the arrows are shown as pointing up and down to indicate the magnetization vectors of the ferromagnetic layers 50 and 52 are orthogonal to the applied field.

Figure 3B:
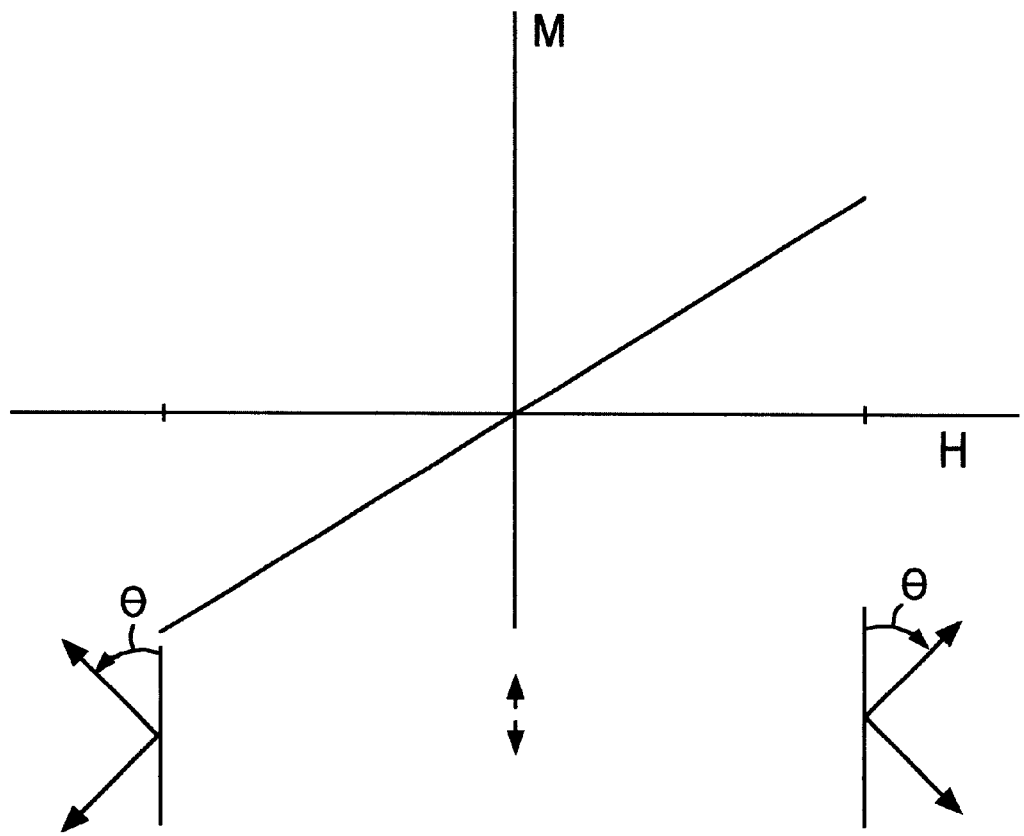
FIG. 3B is a magnified illustration of the hysteresis loop of FIG. 3A for a reference layer according to embodiments of the present invention.

FIG. 3B illustrates a detail of the hysteresis loop of FIG. 3A showing low applied magnetic fields. Under magnetic fields that are typical for read and write operations in a magneto-resistive device the amount of rotation away from 180 degrees between the magnetic vectors M2A and M2B may be very small. For example, when the applied magnetic field is approximately 100 Oersted (8000 Amperes/Meter), the angle theta may be approximately 2 degrees. Theta is the angle by which the magnetic vectors M2A and M2B deviate from being orthogonal to the applied field. Thus, the magnetic vectors are nearly orthogonal to the applied field under normal operating conditions. This state is also shown in FIGS. 2A and 2B.

Figure 5:
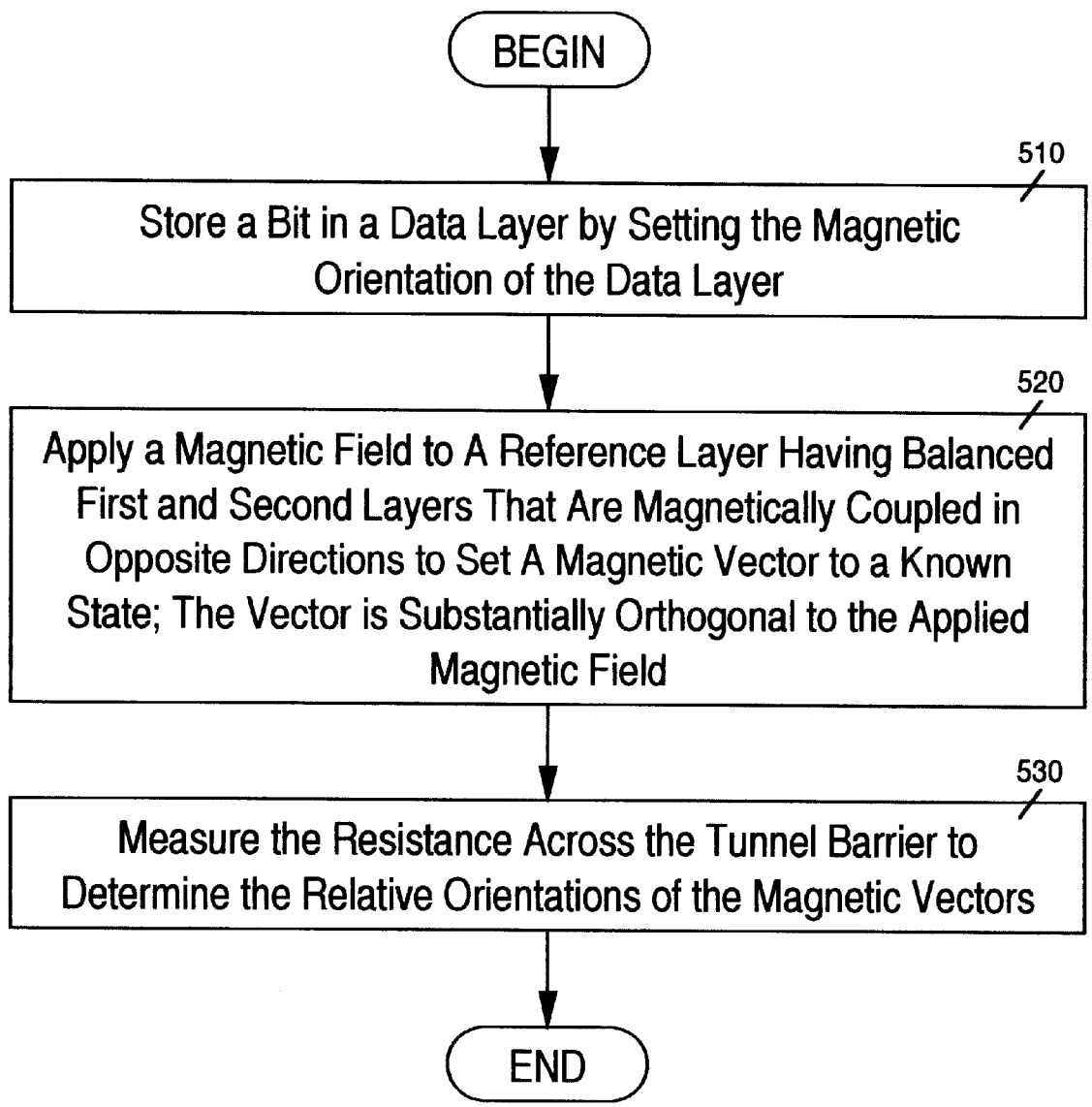
FIG. 5 is a flowchart of steps of a process of reading a bit on a magnetic memory device according to embodiments of the present invention.

Referring now to the flowchart of FIG. 5, an embodiment provides for a method of operating a magnetic storage device. Step 510 of the process is storing bit of information in the data layer 12. This may be achieved by applying one or more currents to selected word lines 18 and/or bit lines 20 to set the magnetization vector Ml in the data layer 12. The magnetic orientations M2A, M2B of the ferromagnetic layers 50 and 52 are not critical at this time, as they may be established later.

For example, in one embodiment, data may be written to the magnetic tunnel junction 11 by supplying write currents to the first and second conductors 18 and 20. The current supplied to the first conductor 18 creates a magnetic field about the first conductor 18, and the current supplied to the second conductor 20 creates a magnetic field about the second conductor 20. The two magnetic fields, when combined, exceed the coercivity of the data layer 12 and, therefore, cause the magnetization vector (Ml) of the data layer 12 to be set in a desired orientation (the orientation will depend upon the directions of the currents supplied to the first and second conductors 18 and 20). The magnetization will be set to either the orientation that corresponds to a logic '1' or the orientation that corresponds to a logic '0'.

After write currents are removed from the conductors 18 and 20, the magnetization vector (M1) of the data layer 12 retains its orientation. The magnetization vectors (M2A and M2B) of the ferromagnetic layers 50 and 52 may be affected by the write process and may or may not retain that orientation. If the reference layer 14 is "ultra-soft," the magnetization vectors (M2A and M2B) may lose their magnetization orientations when the write currents are removed from the first and second conductors 18 and 20.

In one embodiment, the third conductor 22 may be used to assist with write operations. By supplying a current to the third conductor 22 during write operations, the resulting magnetic field about the third conductor 22 may combine with the other two magnetic fields to help set the magnetization vector (M1) of the data layer 12 in the desired orientation.

In step 520, a magnetic field is applied to a reference layer 14 to establish a magnetic orientation (e.g., M2A) in a layer (e.g., ferromagnetic layer 52) of the reference layer 14 that is substantially orthogonal to the magnetic field. The reference layer 14 itself has first and second layers that have substantially the same coercivity and are magnetically coupled in opposite directions. The magnetic orientation of the first ferromagnetic layer 52 of the reference layer 14 is either substantially parallel or substantially anti-parallel to the magnetic orientation M1 in the data layer 12.

For example, a current may be supplied to the third conductor 22, and the resulting magnetic field causes the magnetization vectors M2A and M2B of the ferromagnetic layers 50 and 52 to assume a specific orientation. Because the third conductor 22 is farther from one ferromagnetic layer 50 or 52 than the other, the magnetic orientation may be known by its preference to favor one direction in each ferromagnetic layer 50, 52, the direction depending, in part, on the direction of the current through the third conductor 22. The resulting magnetic field does not affect the magnetization vector (M1) of the data layer 12. Furthermore, since the coercivity of the reference layer 14 is extremely low, the magnitude of the third conductor current may be low. For example, the coercivity of the balanced synthetic ferrimagnet reference layer 14 may be only a few Oersteds (e.g., a few hundred Amperes/Meter).

In step 530, the resistance between the first ferromagnetic layer 52 and the data layer 12 is measured to determine the magnetic orientation M1 of the data layer 12. In this fashion, the bit stored in the storage device is determined. This step may be accomplished by applying a voltage across the magnetic tunnel junction 11 as the current is supplied to the third conductor 22. The first and second conductors 18 and 20 may be used to apply the voltage across the magnetic tunnel junction 11. The voltage causes a sense current to flow through the magnetic tunnel junction 11. The sensed current ($I_s$) is inversely proportional to the resistance of the magnetic tunnel junction 11. Thus, $I_s = V/R$ or $I_s = V/(R+\Delta R)$, where V is the applied Voltage, $I_s$ is the sensed current, R is the nominal resistance of the device 10, and $\Delta R$ is the difference in resistance between the parallel magnetization orientation and the anti-parallel magnetization orientation.

Figure 6:
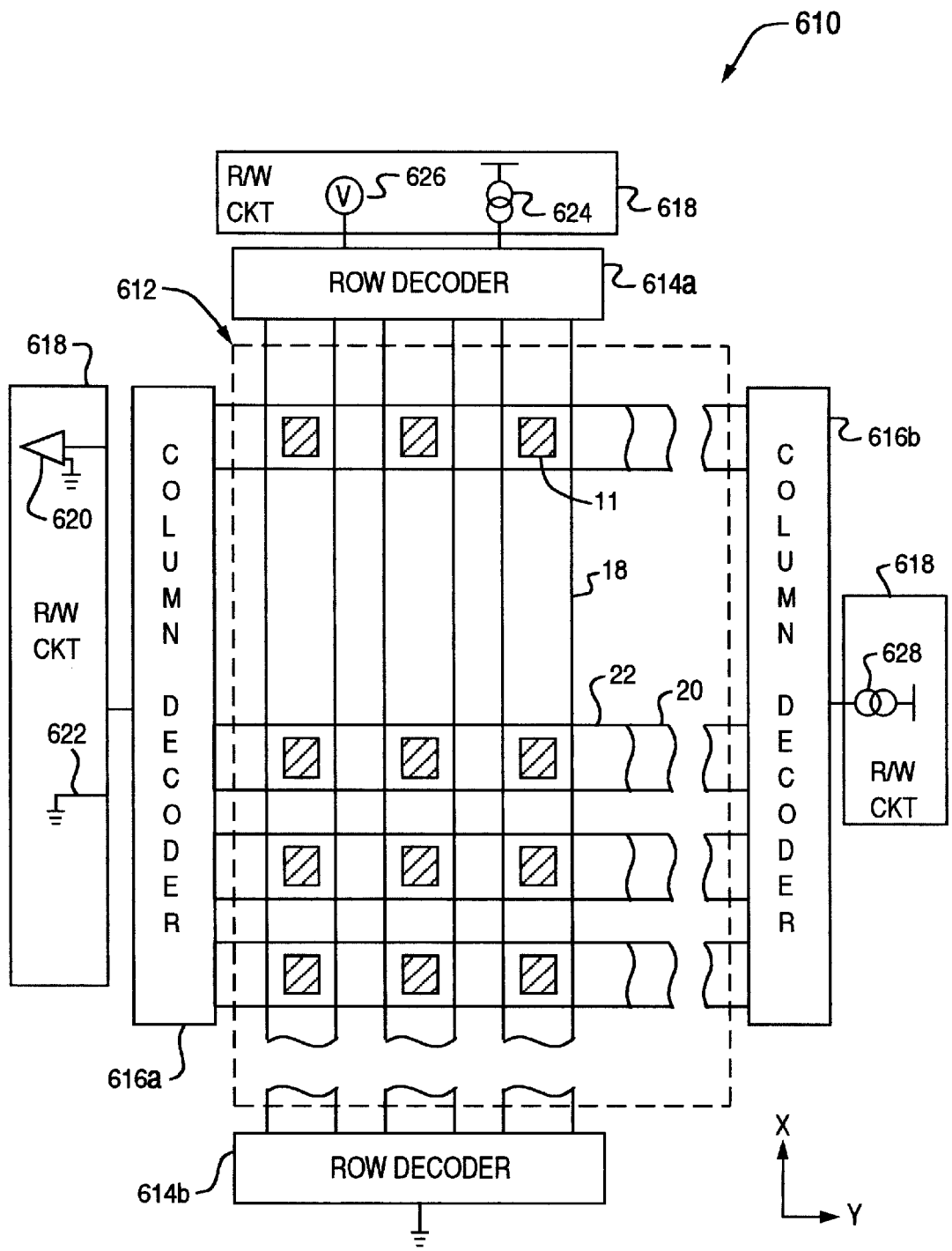
FIG. 6 is an illustration of a magnetic storage device according to embodiments of the present invention.

Reference is now made to FIG. 6, which illustrates an MRAM device 610 including an array 612 of magnetic tunnel junctions 11. The magnetic tunnel junctions 11 are arranged in rows and columns, with the rows extending along a y-direction and the columns extending along an x-direction. Only a relatively small number of the magnetic tunnel junctions 11 are shown to simplify the illustration of the MRAM device 610. In practice, arrays of any size may be used.

Electrically conductive elements functioning as word lines 18 extend along the x-direction in a plane on one side of the array 612. The word lines 18 are in contact with the data layers 12 of the magnetic tunnel junctions 11. Electrically conductive elements functioning as bit lines 20 extend along the y-direction in a plane on an adjacent side of the array 612. The bit lines 20 are in contact with the reference layers 14 of the magnetic tunnel junctions 11. There may be one word line 18 for each row of the array 612 and one bit line 20 for each column of the array 612. Each magnetic memory tunnel junction 11 is located at a cross point of a word line 18 and a bit line 20.

Electrically conductive elements functioning as read lines 22 also extend along the y-direction. The read lines 22 may be further from the tunnel junctions than the bit lines 20, and may be insulated from the bit lines 20. The MRAM device 610 also includes first and second row decoders 614a and 614b, first and second column decoders 616a and 616b, and a read/write circuit 618. The read/write circuit 618 includes a sense amplifier 620, ground connections 622, a row current source 624, a voltage source 626, and a column current source 628.

During a write operation on a selected magnetic tunnel junction 11, the first row decoder 614a connects one end of a selected word line 18 to the row current source 624, the second row decoder 614b connects an opposite end of the selected word line 18 to ground, the first column decoder 616a connects one end of a selected bit line 20 to ground, and the second column decoder 616b connects the opposite end of the selected bit line 20 to the column current source 628. As a result, write currents flow through the selected word and bit lines 18 and 20. The write currents create magnetic fields, which cause the magnetic tunnel junction 11 to switch. The column decoders 616a and 616b may also cause a write current to flow through the read line 22 crossing the selected magnetic tunnel junction 11. This third write current creates an additional magnetic field that assists in switching the selected magnetic tunnel junction 11.

The easy axis of the data layers 12 may be oriented in the y-direction. Thus, the data layers 12 may have their magnetic vectors in the y-direction.

During a read operation on a selected magnetic tunnel junction 11, the first and second column decoders 616a and 616b may cause a steady read (reference) current to flow through the read line 22 crossing the selected magnetic tunnel junction 11. The read current will generate a magnetic field that causes the magnetization vectors M2A and M2B to be oriented parallel to the word lines 18.

While the read current is still applied, the first row decoder 614a connects the voltage source 626 to a selected word line 18, and the first column decoder 616a connects a selected bit line 20 to a virtual ground input of the sense amplifier 620. As a result, a sense current flows through the selected magnetic tunnel junction 11 to the input of the sense amplifier 620. In this fashion, the resistance of the selected magnetic tunnel junction 11 may be determined. However, the present invention is not limited to this method of determining the resistance of the magnetic tunnel junctions 11.

The magnetic tunnel junctions 11 described thus far include individual reference layers 14, with each reference layer 14 having the same geometry as its corresponding data layer. 12 and tunnel barrier 16. However, the present invention is not limited to reference layers 14 having the same geometry as the data layers and tunnel barriers. Instead, the reference layers 14 may have the same geometry as the word and bit lines 18 and 20, or otherwise.

While the present invention has been described in particular embodiments, it should be appreciated that the present invention should not be construed as limited by such embodiments, but rather construed according to the below claims.

What is claimed is:

1. A reference layer for a magnetic storage device, said reference layer comprising:
   a first layer of magnetic material operable to be magnetized in first and second magnetic orientations;
   a second layer of magnetic material operable to be magnetized in first and second magnetic orientations;
   said first and second layers having substantially the same coercivities; and
   a spacer layer between said first and second layers, said spacer layer of suitable dimensions to magnetically couple said first and second layers in opposite directions.

2. The reference layer of claim 1, wherein said first and second layers are constructed such that their magnetic orientations will tend to be substantially orthogonal to the direction of an applied magnetic field.

3. The reference layer of claim 2, wherein the intensity of said applied magnetic field is within the range of typical magnetic fields for reading and writing a magneto-resistive memory device.

4. The reference layer of claim 2, wherein the intensity of said applied magnetic field is on the order of less than a few thousand Amperes/Meter.

5. The reference layer of claim 1, wherein said first and second layers are ferromagnetic layers.

6. The reference layer of claim 1, wherein said spacer layer is electrically conductive and magnetically non-conductive.

7. The reference layer of claim 1, wherein said first and second layers are substantially the same thickness.

8. A magnetic storage device comprising:
   a synthetic ferrimagnet reference layer;
   a data layer having a first and a second magnetic orientations;
   a tunnel layer between said synthetic ferrimagnet reference layer and said data layer;

said synthetic ferrimagnet reference layer comprising:
a first layer of magnetic material;
a second layer of magnetic material;
said first and said second layers operable to be magnetized to cause the net magnetic moment of the synthetic ferrimagnet reference layer to be substantially zero; and
a spacer layer between said first layer and said second layer, said spacer layer with dimensions to magnetically couple said first layer and said second layer in opposite directions;
said synthetic ferrimagnet reference layer having two stable magnetic orientations, a first in which said first layer is in a first direction and said second layer is in an opposite direction and a second stable state in which said first layer is in said opposite direction and said second layer is in said first direction, said directions being substantially orthogonal to an applied magnetic field.

9. The device of claim 8, further comprising means for creating a magnetic orientation in said second layer that is either substantially parallel or anti-parallel to said magnetic orientation of said data layer.

10. The device of claim 8, wherein said second layer is positioned relative to said data layer such that said two stable magnetic orientations comprise a first range of angles and a second range of angles relative to said magnetic orientation in said data layer, wherein the electrical resistance across said spacer layer has first and second resistances corresponding to said two stable orientations.

11. The device of claim 8, wherein said second layer is positioned relative to said data layer such that said two stable magnetic orientations comprise a substantially parallel and a substantially anti-parallel orientation relative to said magnetic orientation in said data layer.

12. The device of claim 8, wherein easy axes of said first layer and said second layer are substantially orthogonal to an easy axis of said data layer.

13. The device of claim 8, wherein said applied magnetic field is stronger in one layer of said first layer and said second layer, wherein which of said two stable magnetic orientations that said reference layer is known.

14. The device of claim 8, wherein said applied magnetic field is less than 1000 Amperes/Meter.

15. A method of operating a magnetic storage device, said method comprising:
a) storing a bit in said device by applying a magnetic field to a data layer in said device to create a magnetic orientation in said data layer;
b) applying a magnetic field to a reference layer having first and second layers with substantially the same coercivity and that are magnetically coupled in opposite directions, said applied magnetic field establishing a magnetic orientation in said first layer of said reference layer that is substantially orthogonal to said applied magnetic field; and
c) measuring the resistance between said first layer and said data layer to determine the magnetic orientation of said data layer, wherein the bit stored in said storage device is determined.

16. The method of claim 15, wherein b) comprises applying said magnetic field to cause said magnetic orientation in said first layer of said reference layer to be either substantially parallel or substantially anti-parallel to said magnetic orientation in said data layer.

17. The method of claim 15, wherein b) comprises applying said magnetic field in a direction that is substantially parallel to the easy axis of said first layer of said reference layer.

18. The method of claim 15, wherein b) comprises applying said magnetic field asymmetrically in a region of said first and second layers, wherein said magnetic orientation of said first layer is forced to a known position.

19. The method of claim 15, wherein b) comprises applying a current near said reference layer.

20. The method of claim 15, wherein c) comprises applying a voltage between said first layer and said data layer.

21. A magnetic storage device comprising:
an array of storage cells, said cells comprising:
a first layer of magnetic material having first and second magnetic orientations;
a second layer of magnetic material having first and second magnetic orientations;
said first and said second layers having substantially the same coercivities;
a spacer layer between said first and said second layers, said spacer layer for magnetically coupling said first and second layers in opposite directions, wherein said magnetic orientations of said first and said second layers tend to be substantially orthogonal to the direction of an applied magnetic field.

22. The storage device of claim 21, further comprising:
a plurality of first electrically conductive elements extending along said array in a first direction;
a plurality of second electrically conductive elements extending along said array in a second direction;
a plurality of third electrically conductive elements extending in said second direction, said second and third electrically conductive elements being separated by an electrical insulator.

23. The storage device of claim 22, wherein the easy axis of at least one of said second layers is substantially parallel to said second electrically conductive elements and the easy axis of at least one of said first layers is substantially orthogonal to said second electrically conductive elements.

24. The storage device of claim 22, further comprising a circuit for applying a current to a first selected element of said third electrically conductive elements to set said magnetic orientation of said first layer of one of said cells to a known position.

25. The storage device of claim 24, further comprising a circuit for applying a voltage between a first selected element of said first electrically conductive elements and a first selected element of said second electrically conductive elements.

26. The storage device of claim 25, further comprising a circuit for measuring current through said first selected element of said second electrically conductive elements to measure resistance between said first layer and said data layer.

27. A synthetic ferrimagnet reference layer for a magnetic storage device, said reference layer comprising:
a plurality of layers of magnetic material having first and second magnetic orientations;
at least one spacer layer, said at least one spacer layer between adjacent layers of said plurality of layers, said at least one spacer layer of suitable dimensions to magnetically couple said adjacent layers in opposite directions; and
said plurality of layers of magnetic material operable to be magnetized to cause the net magnetic moment of the reference layer to be substantially zero.

28. The reference layer of claim 27, wherein said plurality of layers of magnetic material are constructed such that their magnetic orientations will tend to be substantially orthogonal to the direction of an applied magnetic field.

29. The reference layer of claim 28, wherein the intensity of said applied magnetic field is within the range of typical magnetic fields for reading and writing a magneto-resistive memory device.

30. The reference layer of claim 28, wherein the intensity of said applied magnetic field is on the order of less than a few thousand Amperes/Meter.

31. The reference layer of claim 27, wherein said plurality of layers of magnetic material are ferromagnetic layers.

32. The reference layer of claim 27, wherein said at least one spacer layer is electrically conductive and is not a magnetic material.

33. The reference layer of claim 27, wherein said plurality of layers of magnetic material are substantially the same thickness.

* * * * *